(12) United States Patent
Sotoyama

(10) Patent No.: US 7,326,476 B2
(45) Date of Patent: Feb. 5, 2008

(54) FLUORESCENT MATERIAL, ORGANIC ELECTROLUMINESCENT ELEMENT AND ORGANIC ELECTROLUMINESCENT DISPLAY

(75) Inventor: Wataru Sotoyama, Kawasaki (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/801,546

(22) Filed: Mar. 17, 2004

(65) Prior Publication Data

US 2005/0048313 A1 Mar. 3, 2005

(30) Foreign Application Priority Data

Aug. 29, 2003 (JP) .............................. 2003-305621

(51) Int. Cl.
*H01J 1/62* (2006.01)
*C09K 11/06* (2006.01)

(52) U.S. Cl. ............... 428/690; 428/917; 313/504; 313/506; 252/301.16

(58) Field of Classification Search ............... 428/690, 428/917; 252/301.16; 313/504, 506; 257/100
See application file for complete search history.

(56) References Cited

U.S. PATENT DOCUMENTS

| | | | |
|---|---|---|---|
| 5,200,668 A * | 4/1993 | Ohashi et al. .............. | 313/498 |
| 5,686,213 A | 11/1997 | Cosgrove et al. ............. | 430/56 |
| 6,210,817 B1 * | 4/2001 | Igarashi ....................... | 428/690 |
| 6,689,493 B2 * | 2/2004 | Motomatsu et al. ......... | 428/690 |
| 6,747,287 B1 * | 6/2004 | Toguchi et al. ............... | 257/40 |
| 6,753,097 B2 * | 6/2004 | Toguchi et al. .............. | 428/690 |

FOREIGN PATENT DOCUMENTS

| | | |
|---|---|---|
| JP | 3-791 | 1/1991 |
| JP | 7-138562 | 5/1995 |
| JP | 7-142169 | 6/1995 |

* cited by examiner

*Primary Examiner*—Milton I. Cano
*Assistant Examiner*—Camie S. Thompson
(74) *Attorney, Agent, or Firm*—Westerman, Hattori, Daniels & Adrian, LLP.

(57) ABSTRACT

An organic electroluminescent element having an organic light-emitting layer between an anode and a cathode is provided, wherein the organic light-emitting layer comprises, as an organic light-emitting layer forming material, a fluorescent material comprising either one or both of a perylene compound having a specific chemical structure and an anthanthrene compound having a specific chemical structure. A fluorescent material that emits red light with a high color purity and a high luminous efficiency-when used singly or as a guest, an organic EL element having a high luminous efficiency, and a high-performance organic EL display having a high luminous efficiency are realized.

30 Claims, 8 Drawing Sheets

DPVBi p-sesquiphenyl 1,3,8,10-tetraphenylpyrene

X = Cl, Br, I

TPD                α-NPD

BCP 2-(4-tert-butylphenyl)-5-
(4-biphenylyl)-1,3,4-oxadiazole 3-phenyl-4-(1-naphthyl)-5-
phenyl-1,2,4-triazole 3-(4-tert-butylphenyl)-4-phenyl-5-
(4-biphenylyl)-1,2,4-triazole

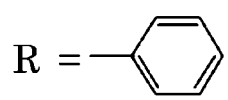 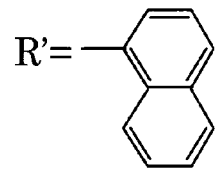

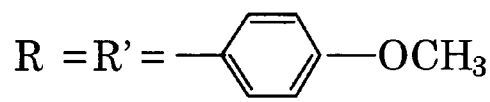
FIG. 15
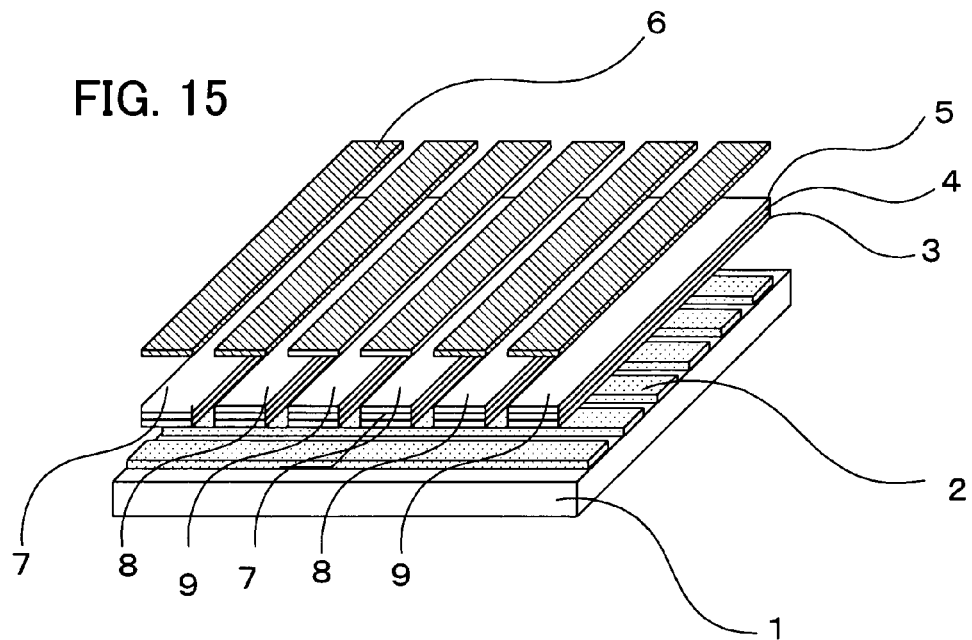

FLUORESCENT MATERIAL, ORGANIC ELECTROLUMINESCENT ELEMENT AND ORGANIC ELECTROLUMINESCENT DISPLAY

CROSS-REFERENCE TO RELATED APPLICATIONS

This application is based upon and claims the benefit of priority from the prior Japanese Patent Application No. 2003-305621, filed on Aug. 29, 2003, the entire contents of which are incorporated herein by reference.

BACKGROUND OF THE INVENTION

1. Field of the Invention

The present invention relates to a fluorescent material, an organic electroluminescent (referred to as "EL" hereinafter) element and an organic EL display.

2. Description of the Related Art

Since a report on a multilayer element wherein a hole (positive hole) transporting organic thin film and an electron transporting organic thin film are laminated (for example, C. W. Tang and S. A. VanSlyke, Applied Physics Letters, vol. 51, p. 913, 1987), it is expected to apply an organic EL element to a flat panel display as a display element having features such as being self-luminous and high-speed response. Specifically, an organic EL element draws much attention as a large-area light-emitting element that can emit light at a voltage as low as 10 volts or less.

Basically, a multilayer organic EL element is composed of an anode (positive electrode)/a hole transport layer/an organic light-emitting layer/an electron transport layer/a cathode (negative electrode). Regarding the layers, it is also possible to have a structure wherein the hole transport layer or the electron transport layer has also a function of an organic light-emitting layer, just like the 2-layer element disclosed in the above-described C. W. Tang and S. A. VanSlyke.

For an organic EL element to have a high luminous efficiency, it is necessary to have an organic light-emitting layer having a high luminous efficiency. As a structure of an organic light-emitting layer, there have been considered a pigment-doped film wherein a small amount of a pigment molecule having a high fluorescence is doped as a guest in a host material or a main component, as well as a single film composed of a single type of material (for example, C. W. Tang, S. A. VanSlyke, and. C. H. Chen, Journal of Applied Physics, vol. 65, p. 3610, 1989).

Perylene derivatives (for example, Japanese Unexamined Patent Application Publications No. H10-97086, paragraph 0003 and H07-138562, paragraph 0037) and anthanthrene as a blue light-emitting material (for example, Japanese Unexamined Patent Application Publication No. H07-142169, paragraph 0032) are known organic light-emitting layer forming materials.

SUMMARY OF THE INVENTION

One aspect of the present invention is a fluorescent material comprising either one or both of a perylene compound represented by formula (1) below and an anthanthrene compound represented by formula (101) below:

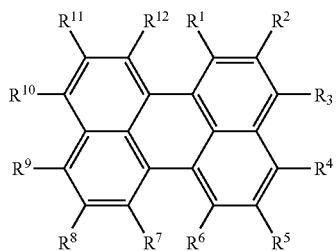

(in formula (1), two or more of $R^{1-12}$, each, have a structure represented by formula (2) below, with the rest being hydrogen),

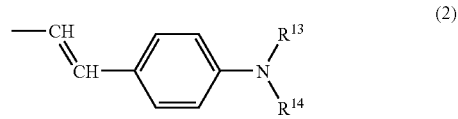

(in formula (2), $R^{13}$ and $R^{14}$ are, independently from each other, an aromatic group that may be substituted, or an aliphatic group that may be substituted, wherein $R^{13}$ and $R^{14}$ may be bonded with each other, directly or via a bonding group); and

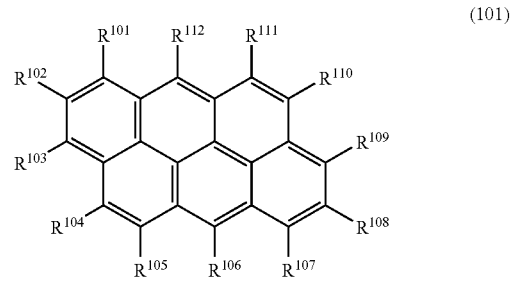

(in formula (101), four or more of $R^{101-112}$, each, have a structure represented by formula (102) below, with the rest being hydrogen),

(in formula (102), $R^{113}$ and $R^{114}$ are, independently from each other an aromatic group that may be substituted, or an aliphatic group that may be substituted, wherein $R^{113}$ and $R^{114}$ may be bonded with each other, directly or via a bonding group).

The fluorescent material according to the present invention shows a high luminous efficiency, and is excellent for use in a high-performance organic EL display.

It is preferable that two of $R^{1-12}$ have a structure represented by formula (2), with the rest being hydrogen, that four of $R^{101-112}$ have a structure represented by formula (102), with the rest being hydrogen, that $R^{13}$ and $R^{14}$ are, independently from each other, a phenyl or naphthyl group that may be substituted, that the phenyl or naphthyl group has a substituent group selected from the class consisting of an alkyl group, an aryl group, an alkoxy group, an aryloxy group, a dialkylamino group-and a diarylamino group, wherein the substituent group may also be substituted, that $R^{113}$ and $R^{114}$ are, independently from each other, a phenyl or naphthyl group-that may be substituted, that the phenyl or naphthyl group has a substituent group selected from the class consisting of an alkyl group, an aryl group, an alkoxy group, an aryloxy group, a dialkylamino group and a diarylamino group that may also be substituted, that the fluorescent material is used as an organic light-emitting layer forming material in an organic EL element, and that the fluorescent material is used as an organic light-emitting layer forming material in the capacity of a host or a guest in an organic EL element.

Another aspect of the present invention is an organic EL element having an organic light-emitting layer between an anode and a cathode, wherein:

the organic light-emitting layer comprises, as an organic light-emitting layer forming material, a fluorescent material comprising either one or both of a perylene compound represented by formula (1) below and an anthanthrene compound represented by formula (101) below;

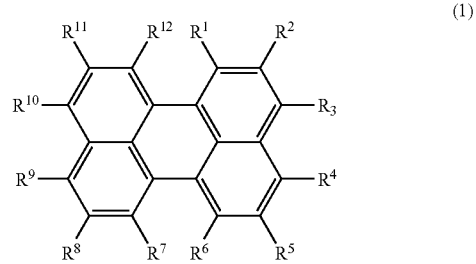

(1)

(in formula (1), two or more of $R^{1-12}$ have a structure represented by formula (2) below, with the rest being hydrogen),

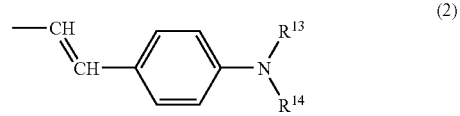

(2)

(in formula (2), $R^{13}$ and $R^{14}$ are, independently from each other, an aromatic group that may be substituted, or an aliphatic group that may be substituted, wherein $R^{13}$ and $R^{14}$ may be bonded with each other, directly or via a bonding group), and

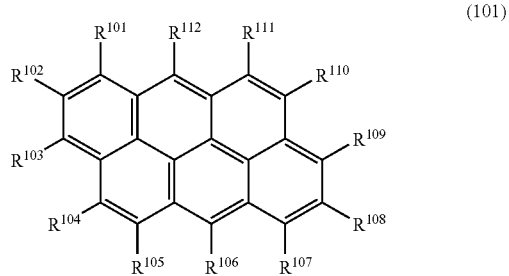

(101)

(in formula (101), four or more of $R^{101-112}$ have a structure represented by formula (102) below, with the rest being hydrogen),

(102)

(in formula (102), $R^{113}$ and $R^{114}$ are, independently from each other, an aromatic group that may be substituted, or an aliphatic group that may be substituted, wherein $R^{113}$ and $R^{114}$ may be bonded with each other, directly or via a bonding group).

According to the present invention, an organic EL element having a high luminous efficiency is provided.

Preferable embodiments for $R^{1-12}$, $R^{101-112}$, $R^{13}$, $R^{14}$, $R^{113}$ and $R^{114}$ are the same as for the above-described fluorescent material.

Furthermore, it is preferable that the fluorescent material is an organic light-emitting layer forming material as a host or guest, that the organic light-emitting layer comprises, as an organic light-emitting layer forming material, a mixture of a fluorescent material and an aromatic amine compound represented by formula (3) below (wherein $Ar^1$ is an aromatic group with a bonding valency of 2, 3 or 4 that may be substituted; $R^{17}$ and $R^{18}$ are, independently from each other, a monovalent aromatic group that may be substituted; and m is an integer of 2-4),

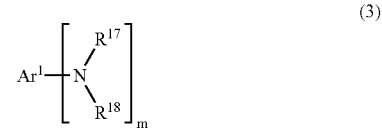

(3)

that the aromatic amine compound represented by formula represented by formula (4) below (wherein $R^{21}$ and $R^{22}$ are, independently from each other, a monovalent aromatic group),

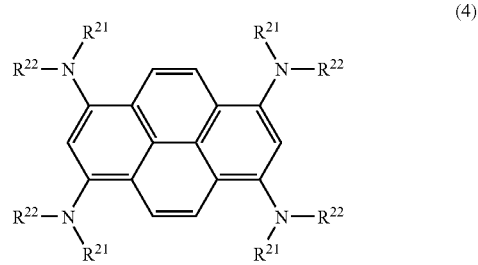

(4)

that the organic light-emitting layer comprises, as an organic light-emitting layer forming material, a mixture of a fluorescent material and a hydroxyquinoline complex represented by formula (5) below (wherein $R^{23}$ is hydrogen or an alkyl group that may be substituted; and M is a metal having a valency of 3),

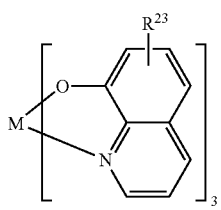

(5)

that the hydroxyquinoline complex is an aluminum hydroxyquinoline complex represented by formula (6) below, and that the organic light-emitting layer consists of a single layer of a fluorescent material.

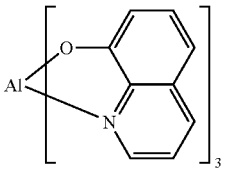

(6)

Still another aspect of the present invention is an organic EL display using the above-described organic EL element.

By the present invention, an organic EL display having a high luminous efficiency and a high performance can be provided.

Accordingly, a fluorescent material having a high luminous efficiency, an organic EL element having a high luminous efficiency, and an organic EL display having a high luminous efficiency and a high performance, are provided by the present invention.

BRIEF DESCRIPTION OF THE DRAWINGS

FIG. 15 is a perspective model view of a passive matrix display for which an organic EL element according to the present invention is used;

DESCRIPTION OF THE PREFERRED EMBODIMENTS

Figure 1:
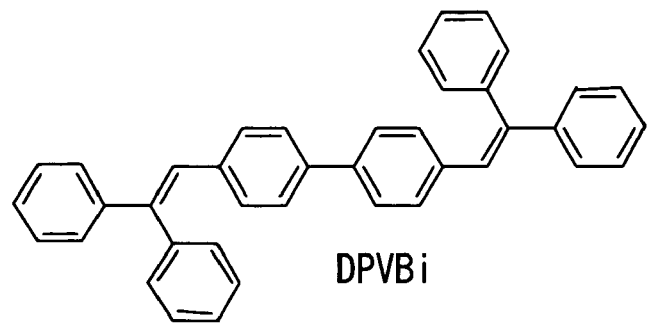
FIG. 1 illustrates examples for a host material.
Figure 1:
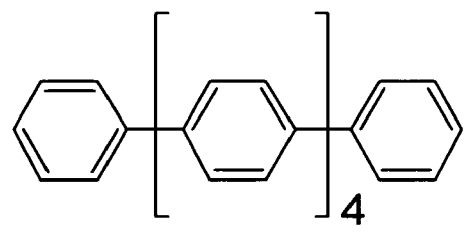
Figure 1:
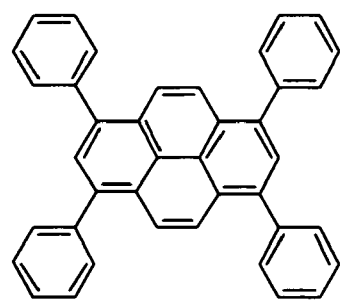

At present, the requirement for a material having a high luminous efficiency is not fully met for an organic light-emitting layer forming material for use in such an application.

It is an object of the present embodiments to solve the above-described problems by providing a fluorescent material having a high luminous efficiency, an organic EL element having a high luminous efficiency, and a high-performance organic EL display using the element. Other objects and advantages of the present invention will be found in the following explanations.

Although the present invention will be described with reference to the following figures, formulae, examples, etc., it is to be understood that these figures, formulae, examples, etc., plus the explanation below are for the purpose of illustrating the present invention, and do not limit the scope of the present invention. It goes without saying that other embodiments should also be included in the category of the present invention as far as they conform to the gist of the present invention. In the figures, the same sign indicates the same element.

As a result of investigations of the above-described problems, it was found that a fluorescent material comprising a specific perylene compound and/or anthanthrene compound, especially a di-substituted perylene compound or a tetra-substituted anthanthrene compound, or both of them has an excellent luminous efficiency, and an organic EL element prepared by using the compound or compounds as an organic light-emitting layer forming material, emits light with a high luminous efficiency. These perylene compounds and anthanthrene compounds can be obtained by comparatively easy synthetic techniques. Here, it is to be noted that "a fluorescent material comprising a perylene compound or an anthanthrene compound or both of them" according to the present invention includes a fluorescent material solely consisting of a perylene compound, a fluorescent material solely consisting of an anthanthrene compound, and a fluorescent material solely consisting of a perylene compound and an anthanthrene compound, as well as a fluorescent material comprising other materials in addition to the compound or compounds.

As a means for applying an organic EL element to a full-color display, a method is widely applied wherein organic EL elements with red, green and blue colors are prepared and are used in combination for forming a single pixel. Regarding the organic EL elements for use in such a full-color display, it is required for them to have a high color purity. The fluorescent material comprising a perylene compound or an anthanthrene compound or both of them according to the present invention, can have a red fluorescence emitting property, and an organic EL element using the material emits red light with a high color purity.

The chemical structures of the specific perylene compound and anthanthrene compound according to the present invention, can be represented by formula (1) and formula (101).

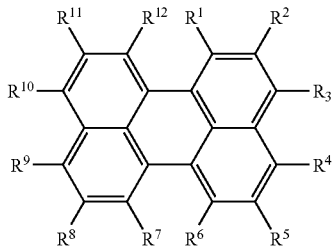

In formula (1), two or more of $R^{1-12}$, each, have a structure represented by formula (2), with the rest being hydrogen. It is preferable that two of $R^{1-12}$, each, have a structure represented by formula (2), with the rest being hydrogen, because the compound is easily synthesized and has an excellent performance. It is to be noted that there is no particular limitation to the positions of $R^{1-12}$ on the ring, and a mixture of compounds with different number, different positions and/or different types of $R^{1-12}$ can also be used.

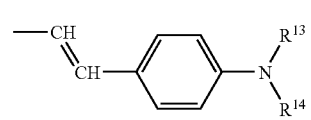

In formula (2), $R^{13}$ and $R^{14}$ are, independently from each other, an aromatic group that may be substituted, or an aliphatic group that may be substituted, wherein $R^{13}$ and $R^{14}$ may be bonded with each other, directly or via a bonding group. $R^{13}$ and $R^{14}$ can, in any case, contain an element other than carbon and hydrogen, including oxygen, sulfur and nitrogen, in its structure. Here, it is to be noted that, in the present invention including the following description, an aromatic group can include an aryl group, a nonbenzenoid aromatic group and a heterocyclic aromatic group, unless otherwise noted.

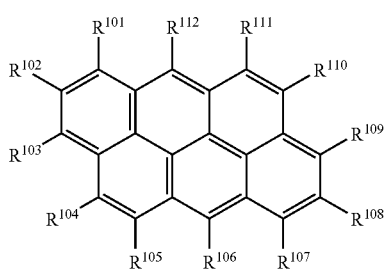

In formula (101), four or more of $R^{101-112}$, each, have a structure represented by formula (102), with the rest being hydrogen. It is preferable that four of $R^{101-112}$, each, have a structure represented by formula (102), with the rest being hydrogen, because the compound is easily synthesized and has an excellent performance. It is to be noted that there is no particular limitation to the positions of $R^{101-112}$ on the ring, and a mixture of compounds with different number, different positions and/or different types of $R^{101-112}$ can also be used.

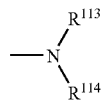

In formula (102), $R^{113}$ and $R^{114}$ are, independently from each other, an aromatic group that may be substituted, or an aliphatic group that may be substituted, wherein $R^{113}$ and $R^{114}$ may be bonded with each other, directly or via a bonding group. $R^{113}$ and $R^{114}$ can, in any case, contain an element other than carbon and hydrogen, including oxygen, sulfur and nitrogen, in its structure.

In any of the above-described cases, as an aliphatic group that may be substituted, for example, a straight-chain, branched-chain, or cyclic hydrocarbon group having 1-10 carbons is preferable. Specifically, methyl, ethyl, propyl, isopropyl, butyl, isobutyl, tertiary butyl, pentyl, isopentyl, hexyl, isohexyl, heptyl, isoheptyl, octyl, isooctyl, nonyl, isononyl, decyl, isodecyl, cyclobutyl, cyclopentyl, cyclohexyl, cycloheptyl, cyclooctyl, cyclononyl, cyclodecyl, etc. are enumerated.

As an aromatic group that may be substituted, for example, a monocyclic aromatic ring group, a group formed by bonding 4 or fewer aromatic rings, a group comprising a fused aromatic ring from 5 or fewer rings wherein the total of the atomic numbers of carbon, oxygen, nitrogen and sulfur is not more than 50, etc., are preferable.

Regarding the single aromatic ring group, there is no particular limitation, and any appropriate group may be selected which serves a purpose. Phenyl, tolyl, xylyl, cumenyl, styryl, mesityl, cinnamyl, phenethyl, and benzhydryl, etc. can be enumerated as an example. They may be substituted with a substituent group.

Regarding the group formed by bonding 4 or fewer aromatic rings, there is no particular limitation, and any appropriate group may be selected which serves a purpose. Naphthyl, anthryl, phenanthryl, indenyl, azulenyl, benzanthracenyl, etc. can be enumerated as an example. They may be substituted with a substituent group.

Regarding the group comprising a fused aromatic ring from 5 or fewer rings wherein the total of the atomic numbers of carbon, oxygen, nitrogen and sulfur is not more than 50, there is no particular limitation, and any appropriate group may be selected which serves a purpose. Pyrrolyl, furyl, thienyl, pyridyl, quinolyl, isoquinolyl, imidazoyl, pyridinyl, pyrrolopyridinyl, thiazoyl, pyrimidinyl, thiophenyl, indolyl, quinolinyl, pyrinyl, adenyl, etc. can be enumerated as an example. They may be substituted with a substituent group.

It is preferable that $R^{13}$ and $R^{14}$ are, independently from each other, a phenyl or naphthyl group that may be substituted. It is more preferable that the phenyl or and naphthyl group has a substituent group selected from the class consisting of an alkyl group, an aryl group, an alkoxy group, an aryloxy group, a dialkylamino group and a diarylamino group that may also be substituted. Organic EL elements using these compounds emit red light with a high color purity.

It is preferable that $R^{113}$ and $R^{114}$ are, independently from each other, a phenyl or a naphthyl group that may be substituted. It is more preferable that the phenyl or the naphthyl group has a substituent group selected from the class consisting of an alkyl group, an aryl group, an alkoxy group, an aryloxy group, a dialkylamino group and a diarylamino group that may also be substituted. Organic EL elements using these compounds emit red light with a high color purity.

A fluorescent material comprising such a perylene compound or an anthanthrene compound or both of them can be used, in accordance with the features of each compound to be used, for emitting light of its own, for emitting light as a light-emitting guest with the aid of a host, and for acting as a host to help other guests to emit light.

It is to be noted that, in the present invention, "organic light-emitting layer forming material" means, unless otherwise noted, a material having at least one of these three functions or a similar function, such as a function for improving the function of a host or a guest.

The fluorescent material comprising a perylene compound or an anthanthrene compound or both of them according to the present invention, can be used as a single perylene compound, a single anthanthrene compound, or a mixture of a perylene compound and an anthanthrene compound, or a mixture of the compounds or one of the compounds with another material. When used as a mixture of a perylene compound and an anthanthrene compound, they may be used as a guest, as a host, or in a guest-to-host relation of each other.

An organic EL element according to the present invention has an organic light-emitting layer between an anode and a cathode wherein the organic light-emitting layer comprises a fluorescent material comprising the above-described perylene compound or anthanthrene compound or both of them, as an organic light-emitting layer forming material. A high luminous efficiency is characteristic of this organic EL element.

As described above, when using a fluorescent material comprising a perylene compound or an anthanthrene compound or both of them according to the present invention, as an organic light-emitting layer forming material for an organic EL element, the organic light-emitting layer may be formed as a single layer of the fluorescent material according to the present invention, or the fluorescent material according to the present invention may be used as a guest dispersed in a host material in an organic light-emitting layer.

When an organic light-emitting layer is formed as a single layer of the fluorescent material according to the present invention, there are advantageous features that it is possible to easily form an organic light-emitting layer having a high luminous efficiency, because a film of a perylene compound or an anthanthrene compound according to the present invention rarely shows thickness nonuniformity due to crystallization or the like, and accordingly, can be formed easily as a uniform amorphous layer, and that the production steps can be simplified because no concurrent vapor deposition with other materials is necessary. However, in this case, lowering of the luminous efficiency due to concentration quenching may occur owing to the light-emitting molecules coming close to each other.

On the other hand, in a host-guest dispersion type organic light-emitting layer, a mixture formed by mixing a perylene compound or an anthanthrene compound or both of them in the capacity of a luminescent pigment with a host material that has an excitation energy larger than that of the perylene compound and/or the anthanthrene compound (that is, a material having a light absorption end that is shorter in wavelength than the perylene compound and the anthanthrene compound), can be used in easily forming a uniform film layer, while preventing lowering of the luminous efficiency due to concentration extinction, and thus maintaining the light emission properties of a single molecule of the compound(s).

In such a case, when the selection of the compounds are made so that the fluorescence spectrum of the host material overlaps with the absorption spectrum of the perylene compound and/or the anthanthrene compound as a guest material in some wavelength region, effective transfer of the excitation energy is made possible from the host to the guest, and efficient light emission from the guest material is realized with little light emission from the host material, resulting in a high-purity light emission.

As a host material when a fluorescent material comprising a perylene compound or an anthanthrene compound or both of them according to the present invention is used as a guest material, 4,4'-bis(2,2'-diphenylvinyl)-1,1'-biphenyl (DPVBi), p-sesquiphenyl, 1,3,8,10-tetraphenylpyrene as shown in FIG. 1, a derivative thereof, an aromatic amine compound, a carbazole compound, a hydroxyquinoline complex, etc. are enumerated. These compounds maybe used singly or in plural.

Among them, the aromatic amine compound is preferably an aromatic amine compound represented by formula (3) or a derivative thereof. In formula (3), $Ar^1$ is an aromatic group with a bonding valency of 2, 3 or 4 that may be substituted. $R^{17}$ and $R^{18}$ are, independently from each other, a monovalent aromatic group that may be substituted. m is an integer of 2-4.

As the carbazole compound, a carbazole compound represented by formula (7) or a derivative thereof is preferable. In formula (7), Ar2 is an aromatic group with a bonding valency of 2, 3 or 4 that may be substituted. $R^{24}$ and $R^{25}$ are, independently from each other, a hydrogen atom, a halogen atom, or an alkyl group, an aralkyl group, an alkenyl group, an aromatic group, a cyano group, an amino group, an acyl group, an alkoxycarbonyl group, a carboxy group, an alkoxy group, an alkylsulfonyl group, a hydroxy group, an amide group, or an aromatic oxy group that may be substituted. n is an integer of 2-4.

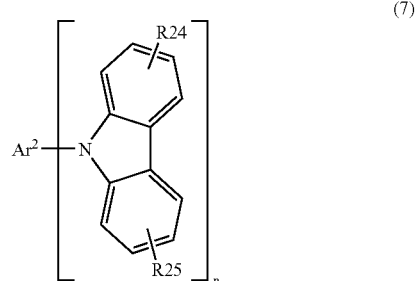

Figure 2:
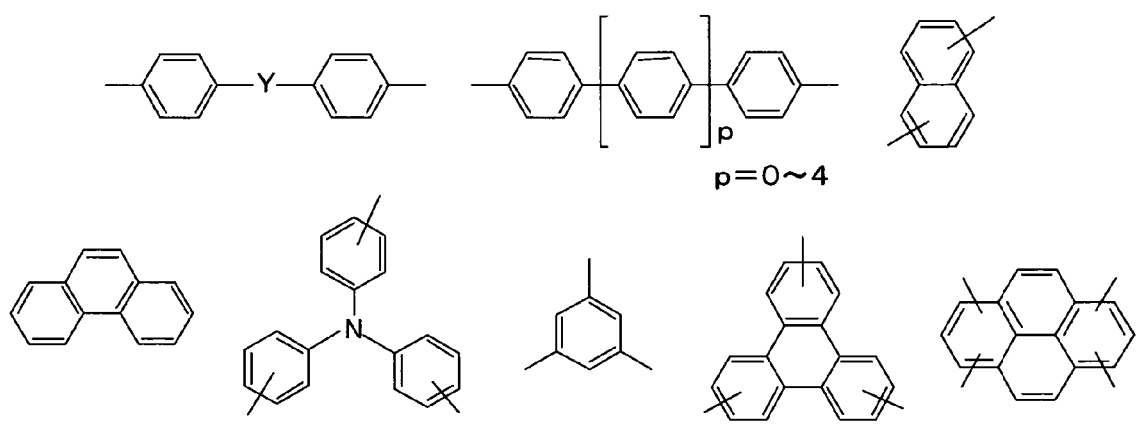
FIG. 2 illustrates examples of $Ar^1$ and $Ar^2$ in formulae (3) and (7)

As examples of $Ar^1$ and $Ar^2$ in formulae (3) and (7), the groups shown in FIG. 2 are enumerated.

Figure 3:
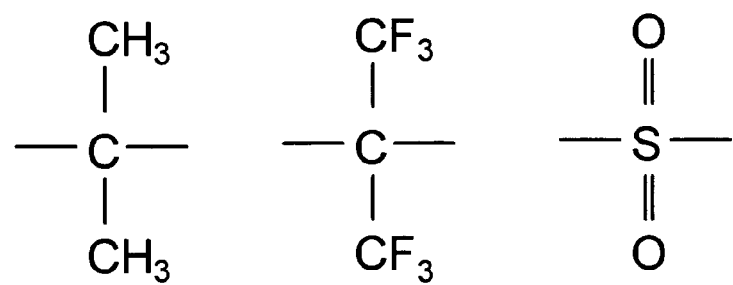
FIG. 3 illustrates examples of the divalent bonding group Y in FIG. 2.

Regarding the above-described groups, a different group may be substituted for the hydrogen. Examples of the divalent bonding group Y for these formulae are shown in FIG. 3.

When mixed with a fluorescent material according to the present invention, the interaction between the aromatic amine compound or the carbazole compound represented by these general formulae and a perylene compound or an anthanthrene compound is small, so that influence on the light-emitting properties intrinsic to the perylene compound or the anthanthrene compound is small. Accordingly, the aromatic amine compound and the carbazole compound are particularly useful as a host material.

Examples of the aromatic amine compound represented by formula (3), are N,N'-diphenyl-N,N'-di-1-naphthyl-[1,1'-biphenyl]-4,4'-diamine (α-NPD) represented by formula (8), or 1,3,6,8-tetrakis(diphenylamino)pyrene (TDPAPY) represented by formula (9). An example of the carbazole compound represented by formula (7) is 4,4'-bis(9-carbazolyl)-biphenyl (CBP) represented by formula (10).

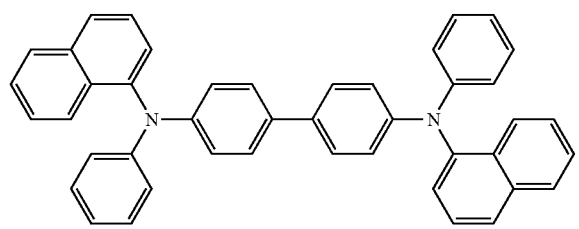

(8)

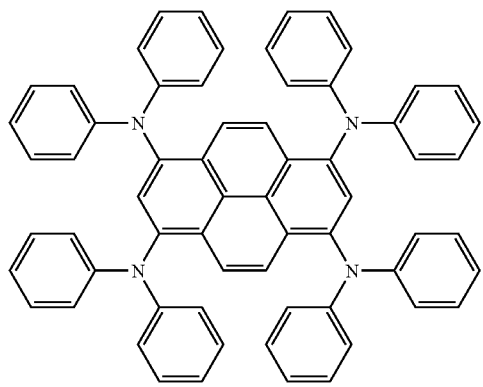

(9)

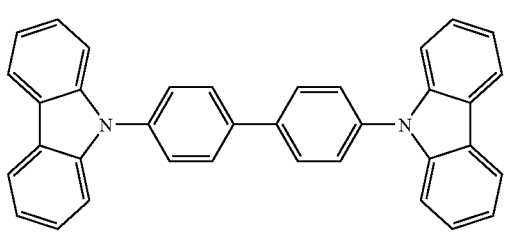

(10)

As a hydroxyquinoline complex, a hydroxyquinoline-oxyaryl complex represented by formula (5) and a derivative thereof are preferable. In formula (5), $R^{23}$ is hydrogen or an alkyl group that may be substituted, and M is a metal having a valency of 3.

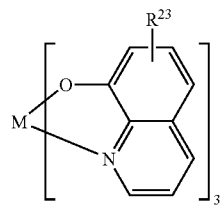

(5)

A more specific example of the hydroxyquinoline-oxyaryl complex represented by formula (5) is an aluminum hydroxyquinoline complex (Alq) represented by formula (6).

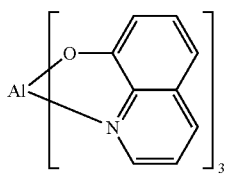

(6)

It is to be noted that in a case wherein such a host material as described above is used, it is possible to make a hole transport and organic light-emitting layer or an organic light-emitting and electron transport layer, by making an organic light-emitting layer have a function of a hole transport layer or an electron transport layer. Aromatic amine compounds can act for providing a function of a hole transport layer, and carbazole compounds and hydroxyquinoline-oxyaryl complexes can act for providing a function of an electron transport layer.

The fluorescent material according to the present invention can also be used as a host material in an organic light-emitting layer of an organic EL element, instead of a guest. For a guest material to be mixed in the organic light-emitting layer in such a case, a material is used that has luminescence having a longer wavelength than the perylene compound and/or the anthanthrene compound in the fluorescent materials used for a host. As long as the requirement that the material for a guest shows luminescence having a longer wavelength than the perylene compound and/or the anthanthrene compound in the fluorescent materials used for a host is satisfied, any one of the fluorescent materials according to the present invention may be used for the guest. Such modification of the wavelength can be realized by selecting the number and/or types of the substituent groups.

There is no limitation to the production method for a perylene compound according to the present invention, and any appropriate method can be selected from known synthetic processes which serves a purpose. For example, the following synthetic method for a di-substituted perylene compound may be favorably applied.

A dihalogenated perylene is synthesized via a halogenation reaction from one equivalent of perylene and two equivalents of halogen. As a halogenation method, the same method as is commonly used for halogenating aromatic hydrocarbons, that is, a method wherein a halogen simple substance is added to perylene dissolved in a solvent, is preferable. As a halogen, bromine and iodine are advantageous for performing the subsequent reaction steps. Bromine is especially favorable owing to the ease of the halogenation reaction.

It is known that the positions of the halogen substitution in perylene are the 3,9-positions or the 3,10-positions as shown in formula (11) below. Although, it is difficult to separate the 3,9-substituted compound from the 3,10-substituted compound, using a mixture of the 3,9-substituted compound and the 3,10-substituted compound will do for the applications described in the examples or the like, since the chemical and spectroscopic properties of the compounds are similar to each other. It is to be noted that substitution by three or more halogens on perylene is difficult under a normal halogenation condition owing to the reactivity and steric hindrance of perylene.

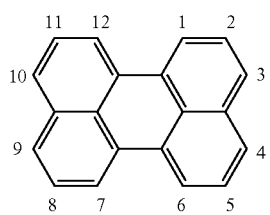

(11)

Figure 4:
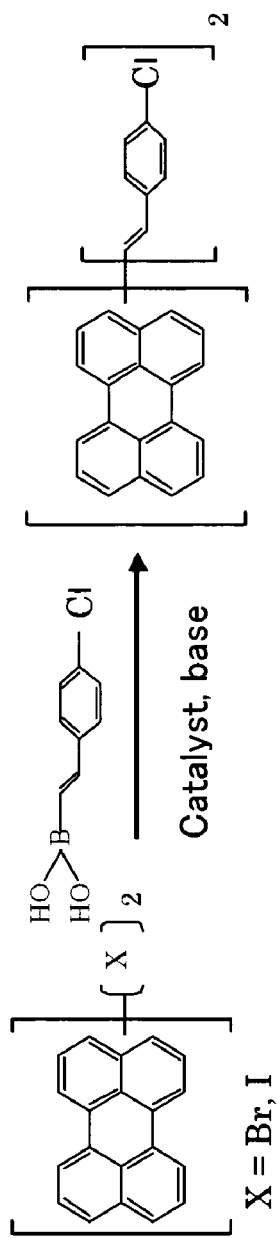
FIG. 4 illustrates a reaction to obtain a di(halogenated phenylvinyl) perylene from a dihalogenated perylene.

Next, as shown in FIG. 4, a halogenated phenylvinylboric acid is reacted with the dihalogenated perylene in the presence of a catalyst and a base so as to obtain a di(halogenated phenylvinyl)perylene. Bromine is preferable as a halogen for a dihalogenated perylene. Chlorine is preferable as a halogen for the phenylvinylboric acid owing to the reactivity with a halogen of the dihalogenated perylene.

As a catalyst for the halogenated-phenylvinylation reaction, it is possible to utilize a palladium compound such as a palladium-triphenylphosphine complex and a palladium-tributylphosphine complex. As a base, it is possible to utilize sodium carbonate, potassium carbonate, sodium hydroxide, a sodium alkoxide such as sodium-t-butoxide, or the like.

Figure 5:
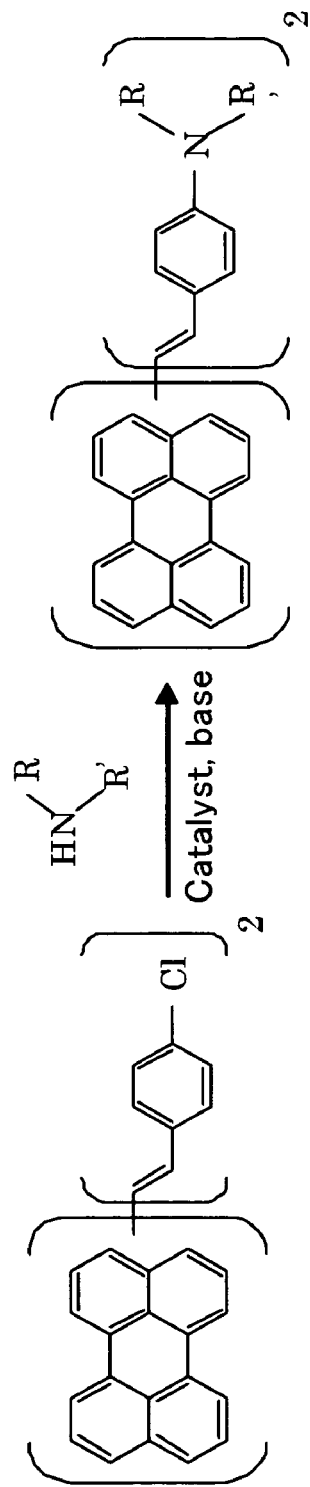
FIG. 5 illustrates a reaction to obtain a perylene compound according to the present invention from a di(halogenated phenylvinyl)perylene.

The compound according to the present invention can be obtained by reacting an amine with the di(halogenated phenylvinyl)perylene in the presence of a catalyst and a base, as shown in FIG. 5.

Figure 6:
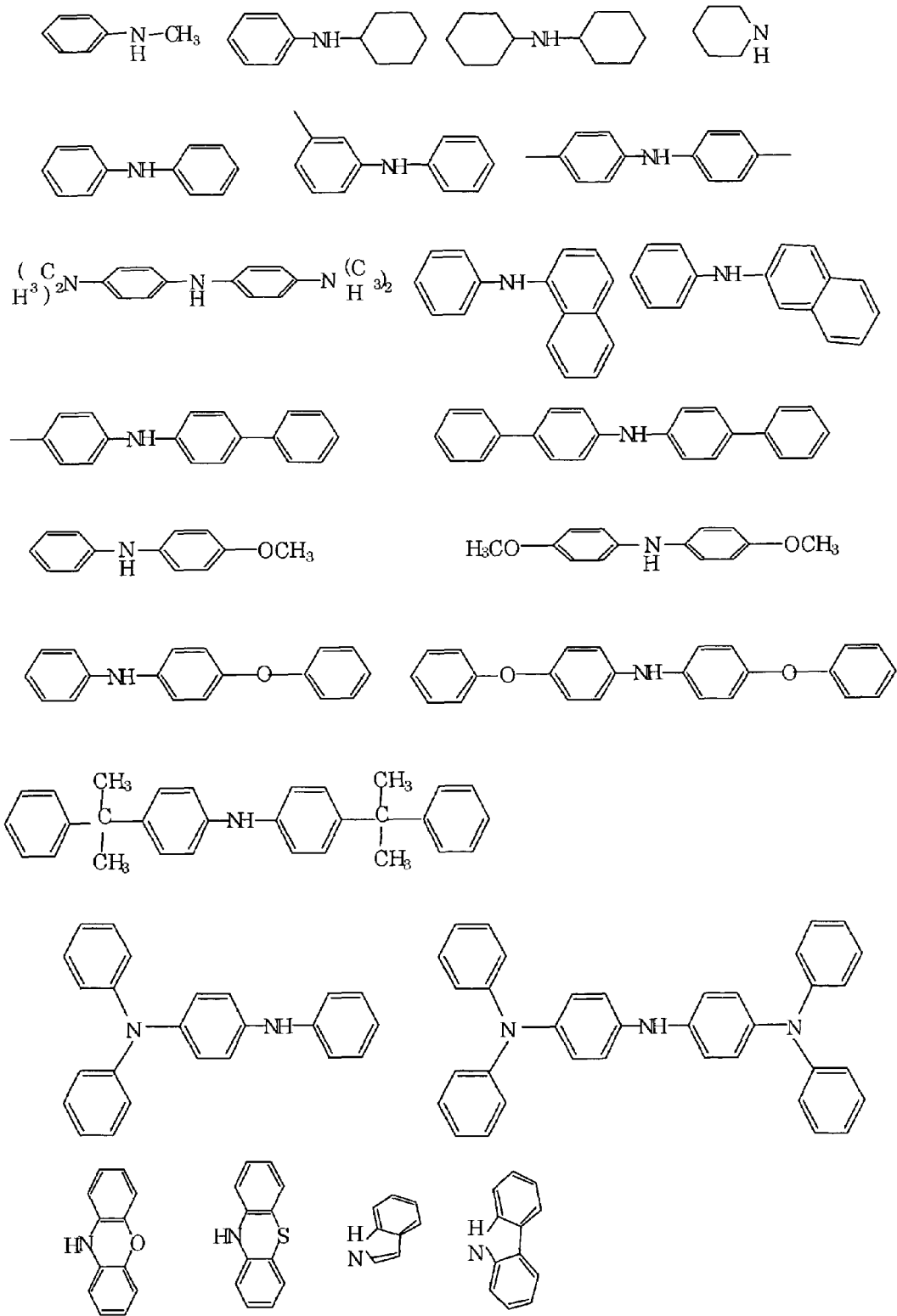
FIG. 6 illustrates examples of an amine that can be used for the amination reaction shown in FIG. 5 or 7.

As a catalyst for the amination reaction, it is possible to utilize a palladium compound such as a palladium-tributylphosphine complex, a copper powder or the like. As a base, it is possible to utilize sodium carbonate, potassium carbonate, sodium hydroxide, a sodium alkoxide such as sodium-t-butoxide, or the like. Examples for the amine that can be used in this reaction are shown in FIG. 6.

There is no limitation to the production method for an anthanthrene compound according to the present invention, and any appropriate method can be selected from known processes which serves a purpose. These methods are known, for example, in "Aromatische Kohlenwasserstoffe Polycyclische Systeme", E. Clar, Springer-Verlag, Berlin, Goettingen, Heiderberg, 1952. Commercial acquisition of anthanthrene is also possible.

For example, the following synthetic method is used preferably in the case of a tetra-substituted anthanthrene compound. A tetrahalogenated anthanthrene can be synthesized by the halogenation reaction between one equivalent of anthanthrene and four equivalents of a halogen. As a halogenation method, the same method as a common halogenation method for aromatic hydrocarbons, that is, a method wherein a halogen simple substance is added to anthanthrene dissolved in a solvent is preferably used. As a halogen, chlorine, bromine and iodine are advantageous for performing the subsequent reaction steps. Chlorine and bromine are especially favorable owing to the ease of the halogenation reaction.

Although it is difficult to determine the halogen substitution positions in anthanthrene by means of usual analyzing means (NMR, IR, UV, etc.), it is estimated through the frontier electron distribution calculation by the molecular orbital method, the 3, 6, 9 and 12 positions as shown in formula (12) below are susceptible to halogen substitution.

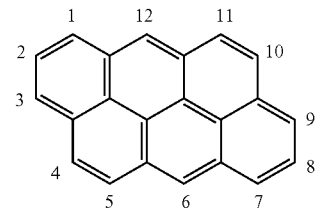

(12)

Figure 7:
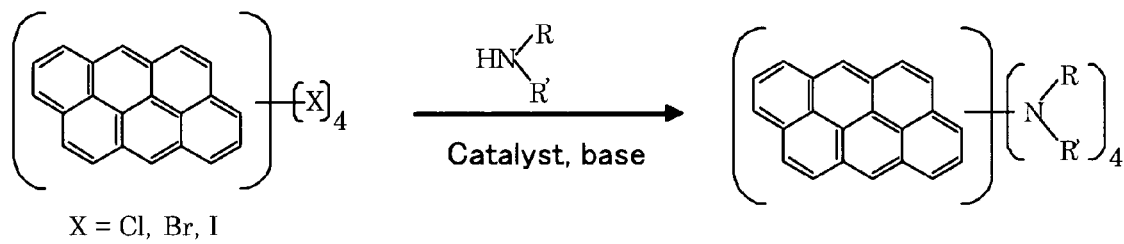
FIG. 7 illustrates a reaction to obtain an anthanthrene compound according to the present invention from a tetrahalogenated anthanthrene.

As shown in FIG. 7, an anthanthrene compound according to the present invention can be obtained by reacting an amine with the tetrahalogenated anthanthrene in the presence of a catalyst and a base.

As a catalyst for the amination reaction, it is possible to utilize a palladium compound such as a palladium-tributylphosphine complex, a copper powder or the like. As a base, it is possible to utilize sodium carbonate, potassium carbonate, sodium hydroxide, a sodium alkoxide such as sodium-t-butoxide, or the like.

Examples for the amine that can be used in this reaction are shown in FIG. 6.

It is to be noted that, as illustrated in the examples, a perylene compound or an anthanthrene compound according to the present invention shows properties sufficient for a fluorescent material and an EL light-emitting material, even in a case where experimental determination of the substitution positions is not feasible.

An organic EL element has a structure wherein a hole injection layer, a hole transport layer, an organic light-emitting layers, an electron transport layer, an electron injection layer, etc. are sandwiched between an anode and a cathode. Among them, the hole injection layer, the hole transport layer, the electron transport layer and the electron injection layer may not exist. Other layers may be included. One layer may have a plural number of functions. Usually, the above-described laminated structure is constructed on a transparent substrate such as glass or the like. This transparent substrate can also be included in an organic EL element according to the present invention.

Examples of the lamination are as follows.

Anode/hole injection layer/hole transport layer/organic light-emitting layer/electron transport layer/electron injection layer/cathode lamination.

Anode/hole injection layer/hole transport layer/organic light-emitting layer/electron transport layer/cathode lamination.

Anode/hole transport layer/organic light-emitting layer/electron transport layer/electron injection layer/cathode lamination.

Anode/hole transport layer/organic light-emitting layer/electron transport layer/cathode lamination.

Anode/hole injection layer/hole transport layer/organic light-emitting and electron transport layer/electron injection layer/cathode lamination.

Anode/hole injection layer/hole transport layer/organic light-emitting and electron transport layer/cathode lamination.

Anode/hole transport layer/organic light-emitting and electron transport layer/electron injection layer/cathode lamination.

Anode/hole transport layer/organic light-emitting and electron transport layer/cathode lamination.

Anode/hole injection layer/hole transport and organic light-emitting layer/electron transport layer/electron injection layer/cathode lamination.

Anode/hole injection layer/hole transport and organic light-emitting layer/electron transport layer/cathode lamination.

Anode/hole transport and organic light-emitting layer/electron transport layer/electron injection layer/cathode lamination.

Anode/hole transport and organic light-emitting layer/electron transport layer/cathode lamination.

Anode/hole transport and electron transport and organic light-emitting layer/cathode lamination.

Next are examples of materials for the layers, thickness thereof and methods for manufacturing them.

Anode

There is no particular limitation to the material for the anode, and any material can be chosen which serves a purpose. For example, metals, alloys, metal oxides, electroconductive compounds, mixtures thereof, etc. can be enumerated. Among these material, those with a work function of 4 eV or more are desirable.

As concrete examples of materials for an anode, an electroconductive metal oxide such as tin oxide, zinc oxide, indium oxide and indium tin oxide (ITO); a metal such as gold, silver, chromium and nickel; a mixture or laminate of such a metal and an electroconductive metal oxide; an inorganic electroconductive material such as copper iodide and copper sulfide; an organic electroconductive material such as polyaniline, polythiophene and polypyrrole; and a laminate of such a material with ITO, are enumerated. They may be used alone, or two or more of them can be used together. Among them, an electroconductive metal oxide is preferable. ITO is particularly preferable, in view of the productivity, high conductivity, transparency, etc.

There is no particular limitation to the thickness of the anode. Any appropriate thickness can be selected according to a material, to be used or the like. A thickness of 1-5,000 nm is preferable, and a thickness of 20-200 nm is more preferable.

The anode is generally formed on a substrate made of glass such as soda lime glass or nonalkali glass, a transparent resin, or the like. When glass is used for a substrate, nonalkali glass, silica, and soda lime glass with a barrier coating are preferable, in order to restrict elusion of ions from the glass.

There is no particular limitation to the thickness of the substrate, as long as it is enough for maintaining the mechanical strength. When glass is used for a substrate, it is usually not less than 0.2 mm, and is preferably not less than 0.7 mm.

The anode can preferably be formed, for example, through a vapor deposition method, a wet film forming method, an electron beam method, a sputtering method, a reactive sputtering method, a molecular beam epitaxy (MBE) method, a cluster ion beam method, an ion plating method, a plasma polymerization method (high-frequency excitation ion plating method), a molecular lamination method, a printing method, a transfer method, a method for coating a dispersion such as ITO by a chemical reaction method (such as a sol-gel method), etc.

The anode may be subjected to cleaning or other treatments in order to decrease the drive voltage of an organic EL element, or to increase the luminous efficiency. As other treatments, UV-ozone treatment, plasma treatment, etc. can be favorably applied, for example, when ITO is used as a material: for the anode.

Hole Injection Layer

There is no particular limitation to the material for the hole injection layer, and any material can be used which serves a purpose. For example, a star-burst amine represented by the following formula (13) (4,4',4"-tris [3-methylphenyl(phenyl)amino]triphenylamine; m-MTDATA), copper phthalocyanine, polyaniline, etc. are desirable.

There is no particular limitation to the thickness of the hole injection layer, and any appropriate thickness can be applied which serves a purpose. For example, a thickness of about 1-100 nm is preferable. A thickness of 5-50 nm is more preferable.

The hole injection layer can be formed favorably, for example, by a vapor deposition method, a wet film forming method, an electron beam method, a sputtering method, a reactive sputtering method, an MBE method, a cluster ion beam method, an ion plating method, a plasma polymerization method (high-frequency excitation ion plating method), a molecular lamination method, an LB method, a printing method, a transfer method, etc.

(13)

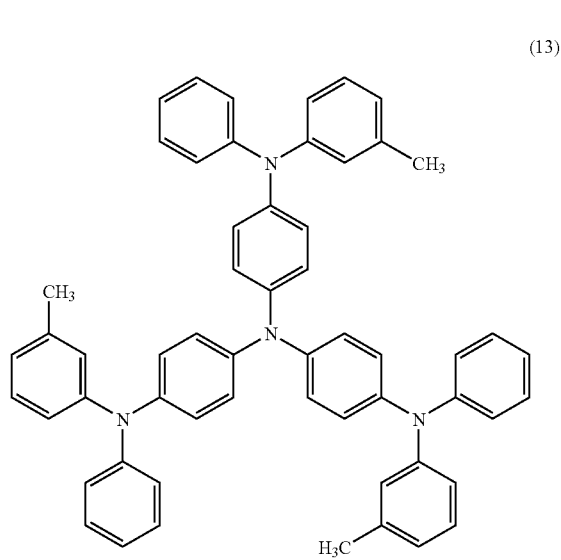

Hole Transport Layer

There is no particular limitation to the material for the hole transport layer, and any appropriate material can be chosen which serves a purpose. For example, an aromatic amine compound, carbazole, imidazole, a triazole, oxazole, an oxadiazole, a polyarylalkane, pyrazoline, pyrazolone, phenylenediamine, an arylamine, an amino-substituted chalcone, a styrylanthracene, fluorenone, a hydrazone, stilbene, a silazane, a styrylamine, an aromatic dimethylidene compound, a porphyrin compound, a polysilane compound, poly(N-vinylcarbazole), an aniline-type copolymer, a thiophene oligomer and polymer, an electroconductive oligomer and polymer such as polythiophene, a carbon film, etc. can be used. It is to be noted that a hole transport and light-emitting layer can be formed by blending such a material for the hole transport layer with a material for the light-emitting layer for film forming.

Figure 8:
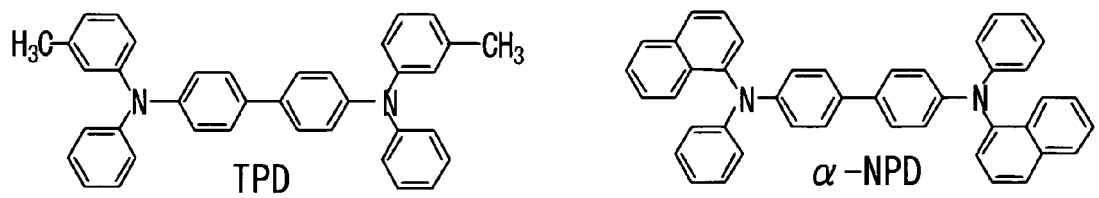
FIG. 8 illustrates examples of an aromatic amine compound that can be used for the hole transport layer.

They can be used alone, or two or more of them can be used together. Among them, an aromatic amine compound is preferable. Specifically, an aromatic amine such as N,N'-diphenyl-N,N'-bis(3-methylphenyl)-[1,1'-biphenyl]-4,4'-diamine (TPD) and N,N'-diphenyl-N,N'-di-1-naphthyl-[1,1'-biphenyl]-4,4'-diamine (α-NPD) as shown in FIG. 8 is more preferable.

There is no particular limitation to the thickness of the hole transport layer, and any appropriate thickness can be applied which serves a purpose. The thickness is usually 1-500 nm. A thickness of 10-100 nm is preferable.

For the formation of the hole transport layer, the same methods as are used for the hole injection layer can be utilized, changing the raw materials and conditions appropriately.

Electron Transport Layer

There is no particular limitation to the material for the electron transport layer, and any appropriate material can be used which serves a purpose. For example, a hydroxyquinoline complex such as tris(8-quinolinolato)aluminum (Alq) represented by formula (6), a hydroxyquinoline-oxyaryl complex such as BAlq, an oxadiazole compound, a triazole compound, a phenanthroline compound, a perylene-compound, a pyridine compound, a pyrimidine compound, a quinoxaline compound, a diphenylquinone compound, a nitro-substituted fluorene compound, etc. can be used. It is to be noted that a light-emitting and electron transport layer can be formed by blending such a material for the electron transport layer with a material for the light-emitting layer for film forming. Furthermore, a hole transport and light-emitting and electron transport layer can be formed by further blending with a material for the hole transport layer for film forming.

There is no particular limitation to the thickness of the electron transport layer, and any appropriate thickness can be applied which serves a purpose. The thickness is usually 1-500 nm. A thickness of 10-50 nm is preferable.

The electron transport layer can be composed of two layers or more. In such a case, a material with a light absorption end that is shorter in wavelength than that of a perylene compound or an anthanthrene compound according to the present invention, is preferable for a material for forming an electron transport layer adjacent to an organic light-emitting layer, since the light emitting region can be limited to the organic light-emitting layer in an element, and redundant luminescence from the electron transport layer can be prevented.

Figure 9:
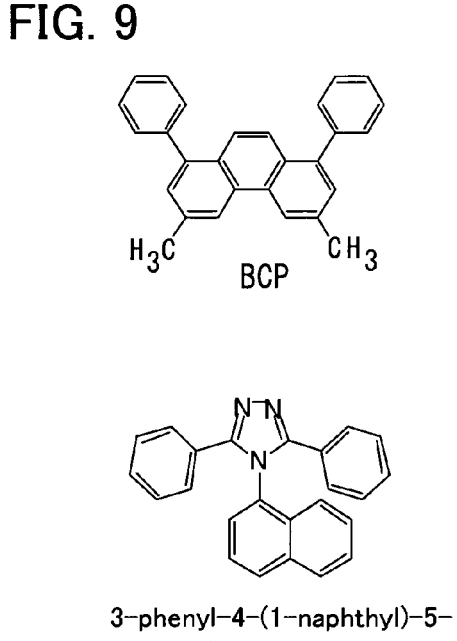
FIG. 9 illustrates examples of a material having a light absorption end that is shorter in wavelength than the perylene compounds and anthanthrene compounds according to the present invention.

As a material with a light absorption end that is shorter in wavelength than that of a perylene compound or an anthanthrene compound according to the present invention, a hydroxyquinoline-oxyaryl complex, a phenanthroline compound, an oxadiazole compound, a triazole compound, 8-quinolinol, and an organic metal complex having such a compound as a ligand can be enumerated. BAlq and compounds shown in FIG. 9 are especially preferable.

It is to be noted that three branches without any chemical group illustrated at each end in the above formulae refers to a tert-butyl group.

For the formation of the electron transport layer, the same methods as are used for the hole injection layer can be utilized, changing the raw materials and conditions appropriately.

Electron Injection Layer

There is no particular limitation to the material for the electron injection layer, and any appropriate material can be used which serves a purpose. For example, an alkali metal fluoride such as lithium fluoride, an alkaline earth metal fluoride such as strontium fluoride, etc. can be used favorably. There is no particular limitation to the thickness of the electron injection layer, and any appropriate thickness can be applied which serves a purpose. The thickness is usually about 0.1-10 nm. A thickness of 0.5-2 nm is preferable.

The electron injection layer can be favorably formed, for example, through a vapor deposition method, an electron beam method, a sputtering method, etc.

Cathode

There is no particular limitation to the material for the cathode, and any appropriate material can be used according to the adhesion to a layer or molecules adjacent to the cathode, such as the above-described electron transport layer or light-emitting layer, ionization potential, stability, etc. For example, a metal, an alloy, a metal oxide, an electroconductive compound, a mixture thereof, etc. can be used.

As concrete examples of materials for the cathode, an alkali metal (Li, Na, K, Cs, etc., for example), an alkaline earth metal (Mg, Ca, etc., for example), gold, silver, lead, aluminum, a sodium-potassium alloy or metal mixture thereof; a lithium-aluminum alloy or metal mixture; a magnesium-silver alloy or metal mixture, a rare earth metal such as indium and ytterbium and an alloy thereof, etc. are enumerated. They can be used alone, or two or more of them can be used together. Among these materials, those with a work function of 4 eV or less are desirable. Aluminum, a lithium-aluminum alloy or metal mixture, a magnesium-silver alloy or metal mixture, etc. are more preferable.

There is no particular limitation to the thickness of the cathode, and any appropriate thickness can be chosen according to materials for the electrode. A thickness of 1-10,000 nm is preferable. A thickness of 20-200 nm is more preferable.

The cathode can preferably be formed, for example, through a vapor deposition method, a wet film forming method, an electron beam method, a sputtering method, a reactive sputtering method, an MBE method, a cluster ion beam method, an ion plating method, a plasma polymerization method (high-frequency excitation ion plating method) a printing method, a transfer method, etc.

When two or more materials are used for the cathode, the materials can be vapor-deposited concurrently to form an alloy electrode or the like. An alloy prepared in advance can also be subjected to vapor deposition for forming an alloy electrode or the like.

Other Layers

The organic EL element of the present invention may have other layers appropriately selected for various purposes. As the other layers, for example, a hole blocking layer, a protection layer, etc. are favorably enumerated.

A hole blocking layer is located between a light-emitting layer and an electron transport layer. When an organic EL element has a hole blocking layer, holes that have been transported from the anode side are blocked by the hole blocking layer, so that electrons that have been transported from the cathode pass through the hole blocking layer and reach the light-emitting layer, thereby effectively causing recombination of the electrons and holes in the light-emitting layer. Accordingly, recombination of the holes and electrons in the organic thin film layers other than the light-emitting layer can be prevented, and luminescence from the luminescent pigment for the purpose of the present invention can be realized efficiently. It is advantageous from the viewpoints of color purity, etc. There is no particular limitation to the material for the hole blocking layer. According to the purpose, an appropriate material can be chosen from among the same materials as for the electron transport layer.

There is no particular limitation to the thickness of the hole blocking layer, and any appropriate thickness can be chosen which serves a purpose. The thickness is usually about 1-500 nm. A thickness of 10-50 nm is preferable. The hole blocking layer may be composed of a monolayer structure. It may also be composed of a laminated structure.

The hole blocking layer can preferably be formed, for example, through a vapor deposition method, a wet film forming method, an electron beam method, a sputtering method, a reactive sputtering method, an MBE method, a cluster ion beam method, an ion plating method, a plasma polymerization method (high-frequency excitation ion plating method), a molecular lamination method, an LB method, a printing method, a transfer method, etc.

A protection layer is a layer that protects an organic EL element from the influence of the environment, and is formed so as to enclose the laminate composed of the above-described respective layers. There is no particular limitation to the material for the protection layer, and any appropriate material can be used which serves a purpose. For example, a material is preferable that can prevent intrusion into an organic EL element, of molecules and substances such as water and oxygen that promote degradation of the organic EL element.

As a material for the protection layer, for example, a metal such as In, Sn, Cu, Al, Ti and Ni, a metal oxide such as MgO, SiO, $SiO_2$, $Al_2O_3$, GeO, NiO, CaO, BaO, $Fe_2O_3$, $Y_2O_3$ and $TiO_2$, a nitride such as SiN and $SiN_xO_y$, a metal fluoride such as $MgF_2$, LiF, $AlF_3$ and $CaF_2$, polyethylene, polypropylene, poly(methyl methacrylate), polyimide, polyurea, poly(tetrafluoroethylene), poly(chlorotrifluoroethylene), poly(dichlorodifluoroethylene), a copolymer from chlorotrifluoroethylene and dichlorodifluoroethylene, a copolymer obtained by copolymerizing a monomer mixture comprising tetrafluoroethylene and at least one type of comonomer, a fluorine-containing copolymer having a cyclic structure in the copolymeric main chain, a hygroscopic material having a water-absorption rate of 1 wt. % or more, a moisture-proof material having a water-absorption rate of 0.1 wt. % or less, etc. are enumerated.

The protection layer can preferably be formed, for example, through a vapor deposition method, a wet film forming method, a sputtering method, a reactive sputtering method, an MBE method, a cluster ion beam method, an ion plating method, a plasma polymerization method (high-frequency excitation ion plating method), a printing method, a transfer method, etc.

Here, it is to be noted that although an organic light-emitting layer can be formed according to known processes, it can desirably be formed, for example, through a vapor deposition method such as a vacuum vapor deposition method, a wet film forming method, an MBE method, a cluster ion beam method, a molecular lamination method, an LB method, a printing method, a transfer method, etc. Among them, a vapor deposition method is preferable, because the layer can be formed efficiently in an simple process at a low cost, and without any organic solvents, thus causing no waste treatment problems. However, a wet film forming method is also desirable when the light-emitting layer is formed in a single layer structure, for example, as a hole transport and light-emitting and electron transport layer or the like.

There is no particular limitation to the vapor deposition method, and any appropriate method can be chosen which serves a purpose from among known methods. For example, a vacuum vapor deposition method, a resistance heating vapor deposition method, a chemical vapor deposition method, a physical vapor deposition method, etc. can be applied. As a chemical vapor deposition method, for example, a plasma CVD method, a laser CVD method, a thermal CVD method, a gas source CVD method. etc. are enumerated.

As a wet film forming method, it is also possible to mix, in a solvent, a host and/or a binder comprising a polymer, etc. with a fluorescent material according to the present invention, and perform coating of a film by means of a wet film forming method such as a spin coating method, an ink jet method, a dip coating method and a blade coating method. In such a case, when the above-described materials for the hole transport layer and the electron transport layer are mixed in the solvent at the same time for film forming so as to improve the charge-transport properties of the organic light-emitting layer, the functions of the hole transport layer and the electron transport layer can be given to the organic light-emitting layer so as to have one layer that can play the role of a hole transport and organic light-emitting layer, an organic light-emitting and electron transport layer as well as a hole transport and organic light-emitting and electron transport layer.

For the binder that is available for such cases, poly(vinylcarbazole), polycarbonate, poly(vinyl chloride), polystyrene, poly(methyl methacrylate), a polyester, polysulfone, poly(phenylene oxide), polybutadiene, a hydrocarbon resin, a ketone resin, a phenoxy resin, a polyamide, ethyl cellulose, poly(vinyl acetate), an ABS resin, a polyurethane, a melamine resin, an unsaturated polyester resin, an alkyd resin, an epoxy resin, a silicone resin, etc. are enumerated.

An organic EL display that uses an organic EL element according to the present invention has a high luminous efficiency. This organic EL element can be used either for a passive matrix panel or active matrix panel (see, for example, "Nikkei Electronics", vol. 765, Mar. 13, 2000, p. 55-62).

To realize a color organic EL display, there are a tri-color light-emitting method wherein organic EL element parts that emit three colors; red green and blue, respectively, are laid on a substrate, a white color emitting method wherein the white color light of a white color light-emitting organic EL element is divided into three primary colors by passing color filters, and a color conversion method wherein blue color of a blue color light-emitting organic EL element is converted into red and green by passing through fluorescent pigment layers (see, for example, "Monthly Display", September, 2000, p. 33-37). Among them, a fluorescent material comprising either one or both of a perylene compound and an anthanthrene compound according to the present invention, can be favorably used for an organic EL element part that emits red light in an organic EL display by the tri-color emitting method, when used singly or as a guest.

For the panel by means of a tri-color light-emitting method, it is necessary to have organic EL element parts, respectively for emitting red, green and blue colors. The following combinations are examples of the light-emitting element parts:

Blue Light-emitting Element Part

ITO (anode)/α-NPD (hole transport layer)/DPVBi/Alq (electron transport and light-emitting layer)/Al—Li (cathode).

Green Light-emitting Element Part

ITO (anode)/α-NPD (hole transport layer)/Alq (electron transport and light-emitting layer)/Al—Li (cathode)

Red Light-emitting Element Part

A structure wherein a disubstituted perylene compound or a tetra-substituted anthanthrene compound according to the present invention is used singly or as a guest (see the examples).

This organic EL element according to the present invention can be used either for a passive matrix display or active matrix display. FIG. 15 shows a case in which an organic EL element according to the present invention is used for a passive matrix display. FIG. shows an example of an anode/hole transport layer/organic light-emitting layer/electron transport layer/cathode structure. In FIG. 15, an organic EL element comprises an anode 2 made of ITO, a hole transport layer 3, an organic light-emitting layer 4, an electron transport layer 5 and a cathode 6 made of metal, laminated successively on a glass substrate 1. The anode 2 made of ITO is a row electrode, and the cathode 6 made of metal is a column electrode. In this figure, red light emission 7, green light emission 8 and blue light emission 9 are materialized by changing the organic light-emitting layer forming materials for the organic light-emitting layer 4.

Figure 16:
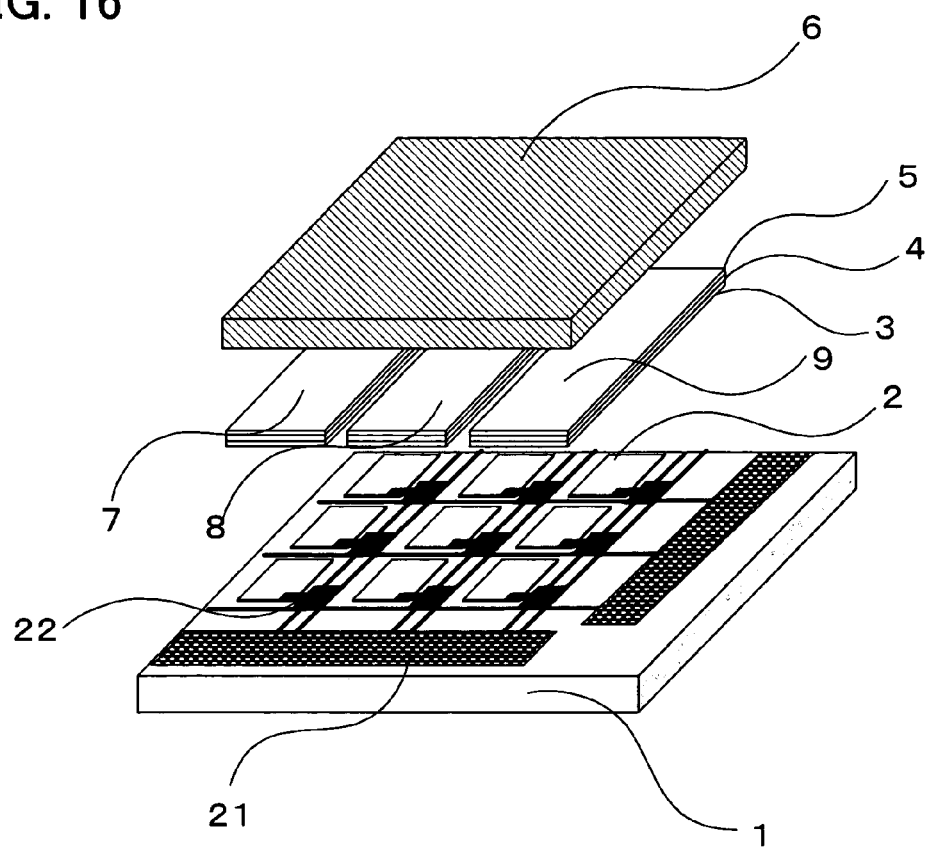
FIG. 16 is a perspective model view of an active matrix display for which an organic EL element according to the present invention is used.

FIG. 16 shows a case in which an organic EL element according to the present invention is used for an active matrix display. FIG. 16 also shows an example of an anode/hole transport layer/organic light-emitting layer/electron transport layer/cathode structure. In FIG. 16, an organic EL element comprises a drive circuit 21, a TFT (Thin Film Transistor) circuit 22, an anode 2 made of ITO, a hole transport layer 3, an organic light-emitting layer 4, an electron transport layer 5 and a cathode 6 made of metal, laminated successively on a glass substrate 1. In this figure, too, red light emission 7, green light emission 8 and blue light emission 9 are materialized by changing the organic light-emitting layer forming materials for the organic light-emitting layer 4.

Examples of the present invention are explained in detail below.

SYNTHESIS EXAMPLE 1

Figure 10:
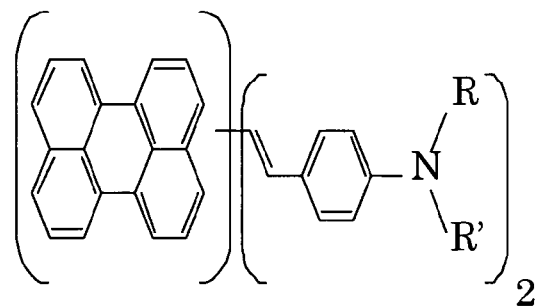
FIG. 10 illustrates the compound of Synthesis Example 1.
Figure 10:
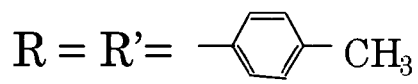

Synthesis of bis-(di-p-tolylaminophenylvinyl)perylene (Compound 1) as shown in FIG. 10

Dibromoperylene was obtained from a reaction of one equivalent of perylene and twice in equivalent of bromine in nitrobenzene.

Next, to one part by mole of the dibromoperylene, were added 2.2 parts by mole of trans-2-(4-chlorophenyl)vinylboric acid, 5 parts by mole of a 2 mol/L aqueous solution of sodium carbonate and 0.06 parts by mole of tetrakis(triphenylphosphine) palladium (0). The mixture was subjected to heating and refluxing to allow reaction for three hours using benzene as a solvent, and then to purification to obtain di-[trans-2-(4-chlorophenyl)vinyl]perylene. To one part by mole of the di-[trans-2-(4-chlorophenyl)vinyl]perylene, 2.2 parts by mole of di-p-tolylamine, 5 parts by mole of sodium tert-butoxide, 0.005 parts by mole of palladium acetate and 0.02 parts by mole of tri(tert-butyl) phosphine were added. The mixture was subjected to heating and refluxing to allow reaction for three hours using o-xylene as a solvent.

After cooling, methanol was added to the reaction solution. A deposit thus formed was washed and recrystallized from THF-methanol to obtain a crude product.

The crude product was purified by sublimation in vacuum to obtain the subject product.

From the mass spectrum of the purified product, a molecular weight of 846 was determined, whereby it was confirmed that the subject disubstituted perylene compound was obtained.

This compound emitted a strong red fluorescence under light irradiation in a common solvent such as acetone and xylene.

SYNTHESIS EXAMPLE 2

Figure 11:
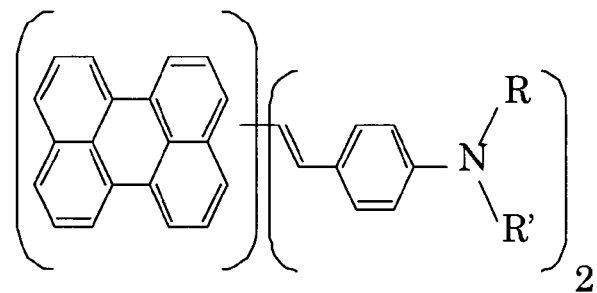
FIG. 11 illustrates the compound of Synthesis Example 2.
Figure 11:
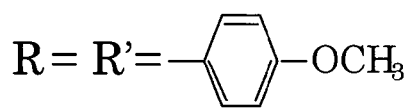

Synthesis of bis-(4,4'-dimethoxydiphenylaminophenylvinyl)perylene (Compound 2) as Shown in FIG. 11

The subject compound was obtained by the same procedure as for Synthesis Example 1 except that 4,4'-dimethoxydiphenylamine was used instead of di-p-tolylamine used in Synthesis Example 1. This compound emitted a strong red fluorescence under light irradiation in a common solvent such as acetone and xylene.

WORKING EXAMPLE 1

Preparation of a Multilayer Organic EL Element

A multilayer organic EL element was prepared as follows, using compound 1 for the light-emitting layer. Specifically, in accordance with FIG. 17, a glass substrate 1 with ITO electrode 2 attached thereon was washed with water, acetone, and isopropyl alcohol. Using a vacuum vapor deposition apparatus ($1.33 \times 10^{-4}$ Pa, the temperature of the substrate being kept at room temperature), a 50 nm-thick α-NPD layer was deposited on the substrate as a hole transport layer 3. A 20 nm-thick compound 1 layer was deposited thereon as a light-emitting layer 4, a 30 nm-thick Alq layer was deposited thereon as an electron transport layer 5, and a 50 nm-thick cathode 6 made of an Al—Li alloy (Li: 0.5 wt. %) was deposited thereon, in a successive way. When voltage was applied to the element between the ITO as an anode and the Al—Li as a cathode, red light emission was observed at 5 V or higher, and red light emission having a brightness of 760 $cd/m^2$ was observed at an applied voltage of 10 V.

WORKING EXAMPLE 2

The same procedure as in Working Example 1 was followed in order to form an organic EL element, except that a layer obtained by concurrent vapor deposition (vapor deposition rate ratio being 10 for compound 1 to 90 for TDPAPY) of compound 1 and 1,3,6,8-tetrakis(diphenylamino)pyrene (TDPAPY) was used in stead of compound 1 only for the light-emitting layer.

When voltage was applied to the element between the ITO as an anode and the Al—Li as a cathode, red light emission was observed at 3 V or higher, and red light emission having a brightness of 1,680 $cd/m^2$ was observed at an applied voltage of 10 V.

WORKING EXAMPLE 3

The same procedure as in Working Example 1 was followed in order to form an organic EL element, except that a layer obtained by concurrent vapor deposition (vapor deposition rate ratio being 10 for compound 1 to 90 for Alq) of compound 1 and Alq was used in stead of compound 1 only for the light-emitting layer.

When voltage was applied to the element between the ITO as an anode and the Al—Li as a cathode, red light emission was observed at 3 V or higher, and red light emission having a brightness of 980 cd/m$^2$ was observed at an applied voltage of 10 V.

WORKING EXAMPLE 4

The same procedure as in Working Example 2 was followed in order to form an organic EL element, except that compound 2 was used in stead of compound 1 as a light-emitting material for the light-emitting layer.

When voltage was applied to the element between the ITO as an anode and the Al—Li as a cathode, red light emission was observed at 3 V or higher, and red light emission having a brightness of 1,660 cd/m$^2$ was observed at an applied voltage of 10 V.

SYNTHESIS EXAMPLE 3

Figure 12:
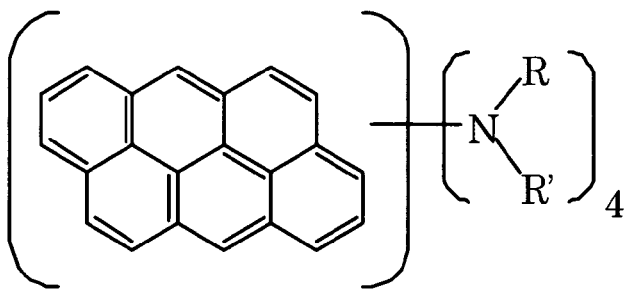
FIG. 12 illustrates the compound of Synthesis Example 3.
Figure 12:
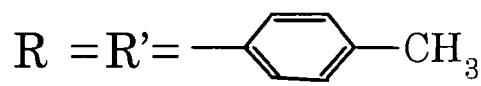

Synthesis of tetrakis(di-p-tolylamino)anthanthrene (Compound 3) Shown in FIG. 12

Tetrabromoanthanthrene was obtained from a reaction of one equivalent of anthanthrene and four times in equivalent of bromine in nitrobenzene.

For the arylamination of tetrabromoanthanthrene, the general synthesis procedure for a triarylamine from a halogenated aryl compound described in "Tetrahedron Letters", vol. 39, 1998, p. 2367 was followed. That is, to one part by mole of tetrabromoanthanthrene, were added 4 parts by mole of 3-methyldiphenylamine, 8 parts by mole of sodium t-butoxide, 0.001 parts by mole of palladium acetate and 0.004 parts by mole of tri(t-butyl)phosphine. The mixture was allowed to react at 130° C. for three hours using o-xylene as a solvent.

After cooling, the reaction mixture was washed with water several times, o-xylene was distilled off, and the oily residue was washed with methanol. It was then recrystallized from THF-methanol to obtain a crude product. The crude product was subjected to sublimation in vacuum to obtain a purified product.

From the mass spectrum of the purified product, a molecular weight of 1,056 was determined, whereby it was confirmed that the subject tetrasubstituted anthanthrene compound was obtained. This compound emitted a strong red fluorescence under light irradiation in a common solvent such as acetone and xylene.

SYNTHESIS EXAMPLE 4

Figure 13:
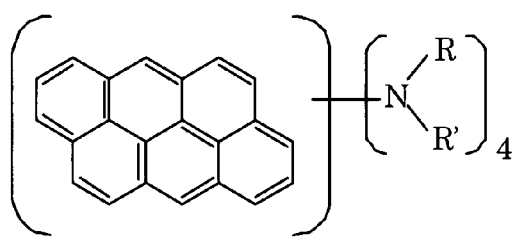
FIG. 13 illustrates the compound of Synthesis Example 4.

Synthesis of tetrakis(N-phenyl-1-naphtylamino)anthanthrene (Compound 4) as Shown in FIG. 13

The subject compound was obtained by the same procedure as for Synthesis Example 3 except that N-phenyl-1-naphthylamine was used instead of 3-methyldiphenylamine in Synthesis Example 3. This compound emitted a strong red fluorescence under light irradiation in a common solvent such as acetone and xylene.

SYNTHESIS EXAMPLE 5

Figure 14:
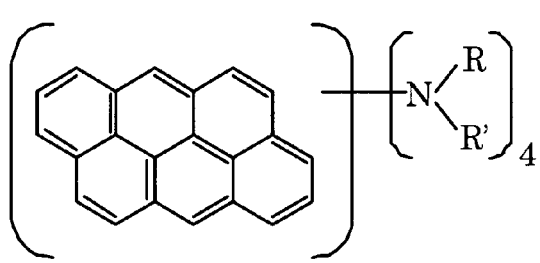
FIG. 14 illustrates the compound of Synthesis Example 5.

Synthesis of tetrakis(4,4'-dimethoxydiphenylamino) anthanthrene (Compound 5) as Shown in FIG. 14

The subject compound was obtained by the same procedure as for Synthesis Example 3 except that 4,4'-dimethoxydiphenylamine was used instead of 3-methyldiphenylamine in Synthesis Example 3. This compound emitted a strong red fluorescence under light irradiation in a common solvent such as acetone and xylene.

WORKING EXAMPLE 5

Preparation of a Multilayer Organic EL Element

A multilayer organic EL element was prepared as follows, using compound 3 for an organic light-emitting layer.

A glass substrate with an ITO electrode attached thereon was washed with water, acetone, and isopropyl alcohol. Using a vacuum vapor deposition apparatus. (1.33×10$^{-4}$ Pa, the temperature of the substrate being kept at room temperature), each layer was formed for the lamination.

Figure 17:
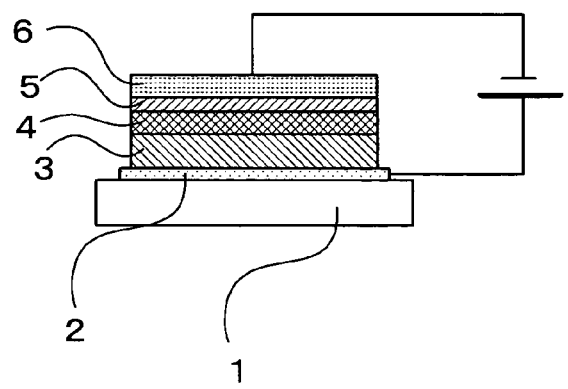
FIG. 17 is a cross-sectional model view of an organic EL element.

Specifically, as shown in FIG. 17, a 50 nm-thick α-NPD layer was deposited as a hole transport layer 3 on a glass substrate 1 with an ITO electrode 2, a 20 nm-thick compound 3 layer was deposited thereon as an organic light-emitting layer 4, a 30 nm-thick Alq layer was deposited thereon as an electron transport layer 5, and a 50 nm-thick cathode 6 made of an Al—Li alloy (Li: 0.5 wt. %) was deposited thereon, in a successive way.

When voltage was applied to the organic EL element between the ITO as an anode and the Al—Li as a cathode, red light emission was observed at 5 V or higher, and red light emission having a brightness of 680 cd/m$^2$ was observed at an applied voltage of 10 V.

WORKING EXAMPLE 6

The same procedure as in Working Example 5 was followed in order to form an organic EL element, except that a layer obtained by concurrent vapor deposition of compound 3 and 1,3,6,8-tetrakis(diphenylamino)pyrene (TDPAPY) was used in stead of compound 3 only for the light-emitting layer.

The vapor deposition rate ratio was 10 for compound 3 to 90 for TDPAPY.

When voltage was applied to the organic EL element between the ITO as an anode and the Al—Li as a cathode, red light emission was observed at 3 V or higher, and red light emission having a brightness of 1,990 cd/m$^2$ was observed at an applied voltage of 10 V.

WORKING EXAMPLE 7

The same procedure as in Working Example 5 was followed in order to form an organic EL element, except that a layer obtained by concurrent vapor deposition of compound 3 and Alq was used in stead of compound 3 only for the light-emitting layer.

The vapor deposition rate ratio was 10 for compound 3 to 90 for Alq.

When voltage was applied to the organic EL element between the ITO as an anode and the Al—Li as a cathode, red light emission was observed at 3 V or higher, and red light emission having a brightness of 1,080 cd/m$^2$ was observed at an applied voltage of 10 V.

WORKING EXAMPLE 8

The same procedure as in Working Example 6 was followed in order to form an organic EL element, except that compound 4 was used in stead of compound 3 as a light-emitting material for the light-emitting layer.

When voltage was applied to the organic EL element between the ITO as an anode and the Al—Li as a cathode, red light emission was observed at 3 V or higher, and red light emission having a brightness of 1,730 cd/M$^2$ was observed at an applied voltage of 10 V.

WORKING EXAMPLE 9

The same procedure as in Working Example 6 was followed in order to form an organic EL element, except that compound 5 was used in stead of compound 3 as a light-emitting material for the light-emitting layer.

When voltage was applied to the organic EL element between the ITO as an anode and the Al—Li as a cathode, red light emission was observed at 3 V or higher, and red light emission having a brightness of 2,070 cd/m$^2$ was observed at an applied voltage of 10 V.

What is claimed is:

1. A fluorescent material comprising a perylene compound represented by formula (1) below:

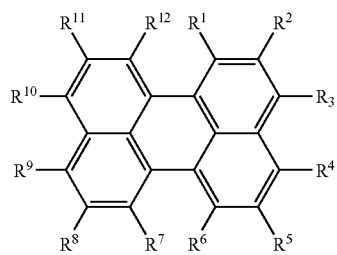

(1)

(in formula (1), two or more of R$^{1-12}$, each, have a structure represented by formula (2) below, with the rest being hydrogen),

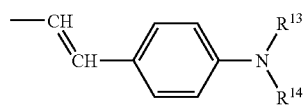

(2)

(in formula (2), R$^{13}$ and R$^{14}$ are, independently from each other, an aromatic group that may be substituted, or an aliphatic group that may be substituted, wherein R$^{13}$ and R$^{14}$ may be bonded with each other, directly or via a bonding group).

2. A fluorescent material according to claim 1, wherein two of said R$^{1-12}$ has a structure represented by formula (2), with the rest being hydrogen.

3. A fluorescent material according to claim 2, wherein said R$^{13}$ and R$^{14}$ are, independently from each other, a phenyl or naphthyl group that may be substituted.

4. A fluorescent material according to claim 3, wherein said phenyl group or naphthyl group, of R$^{13}$ and R$^{14}$, has a substituent group selected from the class consisting of an alkyl group, an aryl group, an alkoxy group, an aryloxy group, a dialkylamino group and a diarylamino group, and the substituent group may also be substituted.

5. A fluorescent material according to claim 3 comprising organic light-emitting layer forming material for an organic electroluminescent element.

6. A fluorescent material according to claim 5 comprising an organic light-emitting layer forming material in the capacity of a host or a guest for an organic electroluminescent element.

7. An organic electroluminescent element having an organic light-emitting layer between an anode and a cathode, said organic light-emitting layer comprising a fluorescent material as in any one of claims 1, 2, 3 and 4.

8. An organic electroluminescent element having an organic light-emitting layer between an anode and a cathode, said organic light-emitting layer using a perylene compound represented by formula (1) below as a fluorescent material:

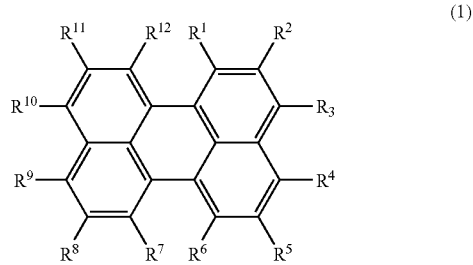

(1)

(in formula (1), two of R$^{1-12}$, each, have a structure represented by formula (2) below, with the rest being hydrogen),

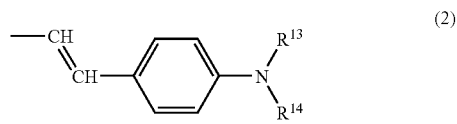

(2)

(in formula (2), R$^{13}$ and R$^{14}$ are, independently from each other, an aromatic group that may be substituted, or an aliphatic group that may be substituted, wherein R$^{13}$ and R$^{14}$ may be bonded with each other, directly or via a bonding group).

9. An organic electroluminescent element according to claim 8, wherein said R$^{13}$ and R$^{14}$ are, independently from each other, a phenyl or naphthyl group that may be substituted.

10. An organic electroluminescent element according to claim 9, wherein, said phenyl group or naphthyl group has a substituent group selected from the class consisting of an alkyl group, an aryl group, an alkoxy group, an aryloxy group, a dialkylamino group and a diarylamino group, and the substituent group may also be substituted.

11. An organic electroluminescent element according to claim 7, wherein said fluorescent material is an organic light-emitting layer forming material in the capacity of a host or a guest.

12. An organic electroluminescent element as in any one of claims 8 to 10, wherein said fluorescent material is an organic light-emitting layer forming material in the capacity of a host or a guest.

13. An organic electroluminescent element according to claim 7, wherein said organic light-emitting layer comprises a mixture of said fluorescent material and an aromatic amine compound represented by formula (3) below as an organic light-emitting layer forming material:

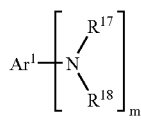
(3)

wherein Ar$^1$ is an aromatic group with a bonding valency of 2, 3 or 4 that may be substituted; R$^{17}$ and R$^{18}$ are, independently from each other, a monovalent aromatic group that may be substituted; and m is an integer of 2-4).

14. An organic electroluminescent element as in any one of claims 8 to 10, wherein said organic light-emitting layer comprises a mixture of said fluorescent material and an aromatic amine compound represented by formula (3) below as an organic light-emitting layer forming material:

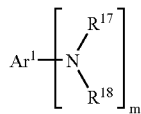
(3)

(wherein Ar$^1$ is an aromatic group with a bonding valency of 2, 3 or 4 that may be substituted; R$^{17}$ and R$^{18}$ are, independently from each other, a monovalent aromatic group that may be substituted; and m is an integer of 2-4).

15. An organic electroluminescent element according to claim 13, wherein said aromatic amine compound represented by formula (3) is a tetra(diarylamino)-substituted pyrene represented by formula (4) below:

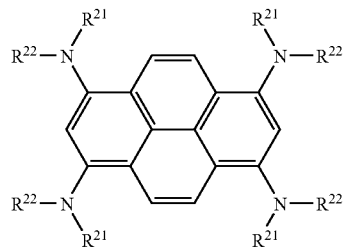
(4)

(wherein R$^{21}$ and R$^{22}$ are, independently from each other, a monovalent aromatic group).

16. An organic electroluminescent element according to claim 14, wherein said aromatic amine compound represented by formula (3) is a tetra(diarylamino)-substituted pyrene represented by formula (4) below:

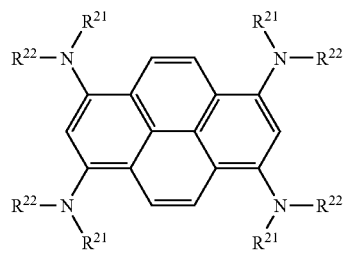
(4)

(wherein R$^{21}$ and R$^{22}$ are, independently from each other, a monovalent aromatic group).

17. An organic electroluminescent element according to claim 7, wherein said organic light-emitting layer comprises, as an organic light-emitting layer forming material, a mixture of said fluorescent material and a hydroxyquinoline complex represented by formula (5) below:

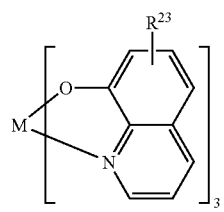
(5)

(wherein R$^{23}$ is hydrogen or an alkyl group that may be substituted; and M is a metal having a valency of 3).

18. An organic electroluminescent element as in any to one of claims 8 to 10, wherein said organic light-emitting layer comprises, as an organic light-emitting layer forming material, a mixture of said fluorescent material and a hydroxyquinoline complex represented by formula (5) below:

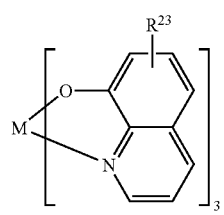
(5)

(wherein R$^{23}$ is hydrogen or an alkyl group that may be substituted; and M is a metal having a valency of 3).

19. An organic electroluminescent element according to claim 17, wherein said hydroxyquinoline complex is an aluminum hydroxyquinoline complex represented by formula (6) below:

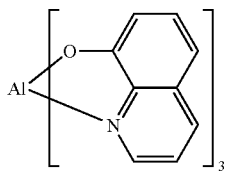
(6)

20. An organic electroluminescent element according to claim 18, wherein said hydroxyquinoline complex is an aluminum hydroxyquinoline complex represented by formula (6) below:

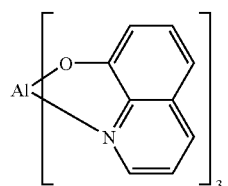
(6)

21. An organic electroluminescent element according to claim 7, wherein said organic light-emitting layer consists of a single layer of a fluorescent material.

22. An organic electroluminescent element as in any one of claims 8 to 10, wherein said organic light-emitting layer consists of a single layer of a fluorescent material.

23. An organic electroluminescent display comprising an organic electroluminescent element of claim 7.

24. An organic electroluminescent display comprising an organic electroluminescent element as in any one of claims 8 to 10.

25. An organic electroluminescent display comprising an organic electroluminescent element of claim 12.

26. An organic electroluminescent display comprising an organic electroluminescent element comprising claim 14.

27. An organic electroluminescent display comprising an organic electroluminescent element comprising claim 16.

28. An organic electroluminescent display comprising an organic electroluminescent element comprising claim 18.

29. An organic electroluminescent display comprising an organic electroluminescent element comprising claim 20.

30. An organic electroluminescent display comprising an organic electroluminescent element comprising claim 22.

* * * * *